US012648111B2

(12) United States Patent
Gajanayake et al.

(10) Patent No.: US 12,648,111 B2
(45) Date of Patent: Jun. 2, 2026

(54) THERMAL MANAGEMENT SYSTEM

(71) Applicant: ROLLS-ROYCE PLC, London (GB)

(72) Inventors: Chandana J Gajanayake, Singapore (SG); Shuai Wang, Singapore (SG); Pranshu Kharbanda, Singapore (SG)

(73) Assignee: ROLLS-ROYCE plc, London (GB)

(*) Notice: Subject to any disclaimer, the term of this patent is extended or adjusted under 35 U.S.C. 154(b) by 258 days.

(21) Appl. No.: 18/373,861

(22) Filed: Sep. 27, 2023

(65) Prior Publication Data

US 2024/0138108 A1 Apr. 25, 2024
US 2024/0237283 A9 Jul. 11, 2024

(30) Foreign Application Priority Data

Oct. 20, 2022 (GB) ...................................... 2215489

(51) Int. Cl.
*H05K 7/20* (2006.01)

(52) U.S. Cl.
CPC ..... *H05K 7/20272* (2013.01); *H05K 7/20254* (2013.01)

(58) Field of Classification Search
CPC ....................... H05K 7/20272; H05K 7/20254
USPC ........................................... 165/104.33, 80.4
See application file for complete search history.

(56) References Cited

U.S. PATENT DOCUMENTS 5,896,922 A 4/1999 Chrysler et al.
6,991,024 B2 * 1/2006 Goodson ............... H10W 40/47 174/15.1
7,088,585 B2 * 8/2006 Chu ..................... H05K 7/2079 361/699
10,693,367 B1 6/2020 Chatterjee et al.
10,945,333 B1 * 3/2021 Joshi .................... H05K 1/0272
11,336,205 B1 5/2022 Brothers et al.
11,664,295 B2 * 5/2023 Chehade ............... F28D 1/0308 361/699
2019/0320555 A1 * 10/2019 Flavin ................ H05K 7/20409
2021/0112687 A1 4/2021 Langenfeld (Continued)

FOREIGN PATENT DOCUMENTS

EP 4116660 A1 1/2023
GB 2605493 A 10/2022

(Continued)

OTHER PUBLICATIONS

Mar. 15, 2024 Extended Search Report issued in European Patent Application No. 23199112.6.

(Continued)

*Primary Examiner* — Joel M Attey
(74) *Attorney, Agent, or Firm* — Oliff PLC

(57) ABSTRACT

A thermal management system for cooling at least one electronic component, the thermal management system including: a heat exchanger connectable to at least one electronic component, the heat exchanger configured to dissipate heat generated by the at least one electronic component; a plurality of cooling channels each connected to a respective pump and the heat exchanger, wherein: each cooling channel is configured to carry fluid between the heat exchanger and the respective pump, and each pump is configured to pump fluid along the respective cooling channel such that fluid carried by each cooling channel flows through the heat exchanger.

17 Claims, 6 Drawing Sheets

(56) References Cited

U.S. PATENT DOCUMENTS

| | | | | |
|---|---|---|---|---|
| 2021/0247140 | A1* | 8/2021 | Aston | F28F 3/12 |
| 2022/0142017 | A1 | 5/2022 | Zhou et al. | |

FOREIGN PATENT DOCUMENTS

| | | | |
|---|---|---|---|
| WO | 2020/037430 | A1 | 2/2020 |
| WO | 2022/106582 | A1 | 5/2022 |

OTHER PUBLICATIONS

Apr. 21, 2023 Search Report issued in UK Patent Application No. GB2215489.2.

* cited by examiner

THERMAL MANAGEMENT SYSTEM

This specification is based upon and claims the benefit of priority from UK Patent Application Number 2215489.2 filed on 20 Oct. 2022, the entire contents of which are incorporated herein by reference.

BACKGROUND

Field of the Disclosure

The present disclosure relates to a thermal management system for cooling at least one electronic component.

Background of the Disclosure

Existing systems for managing heat generated by electronic components use a cold plate whereby heat generated by the electronic component is dissipated by the cold plate.

It will be understood that improvements in systems for cooling electronic components are desirable.

SUMMARY OF THE DISCLOSURE

According to a first aspect there is provided a thermal management system for cooling at least one electronic component, the thermal management system comprising: a heat exchanger connectable to at least one electronic component, the heat exchanger configured to dissipate heat generated by the at least one electronic component; a plurality of cooling channels each connected to a respective pump and the heat exchanger, wherein: each cooling channel is configured to carry fluid between the heat exchanger and the respective pump, and each pump is configured to pump fluid along the respective cooling channel such that fluid carried by each cooling channel flows through the heat exchanger.

Each cooling pump is thereby configured to cool at least one electronic component by carrying fluid between the heat exchanger and the respective pump.

At least two of the plurality of cooling channels may be configured to cool the same at least one electronic component by carrying fluid between the heat exchanger and the respective pumps.

The thermal management system may be configured to cool one or more high voltage, medium voltage and/or low voltage electronic components.

The heat exchanger being connected to a plurality of cooling channels each connected to a respective pump improves the fault tolerance of the thermal management system, That is, each electronic component may be supplied by at least two independent cooling channels thereby providing fault tolerance in a case where one of the cooling channels fails.

The thermal management system may cool plural electronic components.

The heat exchanger may be thermally connected to one or more electronic components such that heat generated by the one or more electronic components transfers to the heat exchanger.

The heat exchanger may be thermally connected to one or more electronic components by a heat conducting mechanical connection or a heat conducting adhesive.

The heat exchanger may dissipate heat from the at least one electronic component to fluid carried by a plurality of cooling channels.

The heat exchanger may be a cold plate. Alternatively, the heat exchanger may be a heat sink.

The fluid may be a liquid, such as water, glycol or a dielectric fluid, or a gas, such as air.

The thermal management system may comprise plural cooling channels.

A cooling channel may be a closed-circuit channel connected between the heat exchanger and a pump.

A cooling channel may be configured to continuously carry fluid between the heat exchanger and a pump while the pump is active (i.e. turned on).

A cooling channel may be a pipe for carrying fluid. The cooling channel may be plastic or metal (e.g. polyurethane or copper).

Each cooling channel may be sealed to the heat exchanger at two different locations.

The cooling channels may be isolated from each other such that fluid is prevented from flowing between the cooling channels.

Fluid may enter the heat exchanger from a cooling channel at a first location (e.g. a sealed compartment inlet), pass through the heat exchanger, and exit the heat exchanger back into the same cooling channel at a second location (e.g. a leased compartment outlet).

The pump may be a liquid pump for pumping water, glycol or a dielectric fluid. Additionally or alternatively, the pump may be a gas pump for pumping gas, such as air.

Optionally, the heat exchanger may comprise first and second sheets, each of the first and second sheets comprising an external surface and an internal surface, at least one electronic component may be mountable on the external surface of the first sheet, and at least one electronic component may be mountable on the external surface of the second sheet.

The first and second sheets may be parallel to each other.

The internal surfaces of the sheets may face each other.

The external surfaces of the sheets may face outwardly in opposite directions.

Plural electronic components may be connected to both external surfaces.

The first and second sheets may be connected together (e.g. mechanically, by welding or fixings).

The electronic components may be mechanically mounted to the external surfaces (e.g. by using mechanical fixings such as nuts and bolts, or screws).

Optionally, the heat exchanger may comprise a plurality of sealed compartments positioned between the internal surfaces of the first and second sheets, each sealed is compartment may be connected to at least one cooling channel such that fluid flows through the sealed compartment, and electronic components may be mountable on the external surfaces of the first and second sheets at positions corresponding to positions of one or more sealed compartments.

Each sealed compartment may be in direct contact with the first and second sheets such that heat generated by one or more electronic components (mounted to one or both external surface) is dispersed towards the sealed compartments for dissipation.

The sealed compartments may be isolated from each other to prevent fluid from passing between the sealed compartments.

Each sealed compartment may be connected to the same cooling channel. Additionally or alternatively, each sealed compartment may be connected to a different cooling channel.

Each electronic component may be mountable at a position overlapping two or more sealed compartments such that each electronic component is cooled by two separate sealed compartments (i.e. a pair of sealed compartments). Each sealed compartment of a sealed compartment pair may be supplied by a different cooling channel.

The sealed compartments may be positioned adjacently along a length of the heat exchanger (i.e. in the same plane). Fluid may flow through the sealed compartments across the width of the heat exchanger (i.e. in a direction perpendicular to the direction of the length of the heat exchanger).

Electronic components may be mounted directly on the external surfaces.

Electronic components may be mounted on the external surfaces adjacently along the length of the heat exchanger at positions that correspond to the adjacent positions of the sealed compartments. The electronic components may be mounted on the external surface(s) directly above and/or below the sealed compartments.

Each sealed compartment may be connected to at least one cooling channel at two different locations. Fluid may enter a sealed compartment from a cooling channel at a first location, pass through the sealed compartment, and exit the sealed compartment back into the same cooling channel at a second location.

The heat exchanger may comprise plural sealed compartments.

The sealed compartments may be separate units thermally connected to the internal surfaces of the first and second sheets. Alternatively, first and second surfaces of the sealed compartments may be the opposing inner surfaces of the first and second sheets such that the sealed compartments are integrated with the sheets.

The heat exchanger may dissipate heat from the at least one electronic component to the fluid as the fluid flows through the sealed compartments.

The sealed compartments may have a circular or rectangular cross-section with first and second openings. The sealed compartments may be sealed, for example, by welding the first and second finned plates and/or the first and second sheets to opposite ends of the sealed compartments to seal the first and second openings closed.

The sealed compartments may be configured to prevent fluid from leaking out of the sealed compartments. The sealing may be performed, for example, by an adhesive or mechanical fixings, instead of welding.

One or more cooling channels may be connected to each sealed compartment at the first and second openings or at dedicated inlets and outlets (e.g. sealed compartment inlets and sealed compartment outlets).

Optionally, the plurality of cooling channels may each comprise a pipe, each pipe being connected to a respective sealed compartment inlet and a respective sealed compartment outlet such that fluid flows through the pipes and the respective sealed compartments, and the diameter of the sealed compartment inlets and/or the sealed compartment outlets may vary according to a position of the at least one sealed compartment to which the respective pipe is connected.

The pipes may be cylindrical. The cylindrical pipes of a given cooling channel may all have the same cross-sectional diameter, or the cross-section diameter may vary.

The cross-section diameter of the pipes may vary between different cooling channels.

The pipes may be plastic or metal pipes (e.g. polyurethane or copper).

The sealed compartment inlets and sealed compartment outlets may be sealed to the sealed compartments to prevent fluid from leaking from the pipes and/or the sealed compartments.

Optionally, the diameter of the sealed compartment inlets and/or the sealed compartment outlets may decrease as a distance between the respective sealed compartment and the respective pump increases.

Optionally, the plurality of cooling channels may comprise first and second cooling channels, wherein: the first cooling channel may be connected to a first group of sealed compartments, and the second cooling channel may be connected to a second group of sealed compartments.

The first and second group of sealed compartments may each comprise a single sealed compartment.

The first group of sealed compartments may be connected to a first group of cooling channels (i.e. plural cooling channels forming a first group of cooling channels).

The second group of sealed compartments may be connected to a second group of cooling channels (i.e. plural cooling channels forming a second group of cooling channels).

The first and second groups of sealed compartments may be positioned adjacently along a length of the heat exchanger.

Optionally, the sealed compartments of the first and second groups of sealed compartments may alternate within the heat exchanger, and each electronic component may be mountable at a position corresponding to a position of an adjacent pair of sealed compartments, wherein first and second sealed compartments of each adjacent pair may be connected to the first cooling channel and the second cooling channel, respectively.

That is, each electronic component may be mountable at a position that overlaps at least two sealed components, each of the two overlapped sealed components being connected to different cooling channels.

Optionally, at least one cooling channel may comprise an auxiliary cooling channel positioned along an edge of the heat exchanger, and which may bypass the sealed compartments, such that fluid may flow through the auxiliary cooling channel at the edge of the heat exchanger.

An edge of the heat exchanger may be an area of the heat exchanger outside of be sealed compartments.

The auxiliary cooling channel and the at least one cooling channel may be connected to the same pump.

Optionally, a cross-sectional diameter of the auxiliary cooling channel may be less than a cross-sectional diameter of the at least one cooling channel.

The auxiliary cooling channel may comprise a cylindrical pipe (e.g. a plastic or metal cylindrical pipe) having a cross-section area.

Optionally, the heat exchanger may comprise a plurality of fins, and wherein: the fins may interconnect with each other within the heat exchanger.

The fins may be thermally connected to the inner surfaces of the first and second sheets, respectively, and/or to the heat exchanger.

The fins may extend into the heat exchanger.

The heat exchanger may dissipate heat from the at least one electronic component to the fluid via the fins as the fluid flows across the fins within the heat exchanger.

The fins may be configured to impinge the flow of fluid as the fluid flows through the heat exchanger.

Optionally, the fins may interconnect with each other within the sealed compartments.

The fins may extend into the sealed compartments.

Optionally, the fins of the first and second finned plates may have a trapezoidal, triangular, rectangular, semi-circular or circular cross-sectional shape.

Optionally, the heat exchanger may comprise first and second opposing finned plates both comprising the fins, fins of the first finned plate may have a first predetermined spacing across the first finned plate and fins of the second finned plate may have a second predetermined spacing across the second finned plate such that the fins interconnect within the heat exchanger in a predetermined arrangement.

The first and second finned plates may be positioned directly opposite each other within the heat exchanger such that the fins may interconnect together.

The fins may be directly connected to the first and second finned plates.

Optionally, the fins of the first finned plate may be equally distributed across the first finned plate according to the first predetermined spacing. Alternatively, the fins of the first finned plate may be non-uniformly distributed across the first finned plate.

Optionally, the fins of the second finned plate may be equally distributed across the second finned plate according to the second predetermined spacing. Alternatively, the fins of the second finned plate may be non-uniformly distributed across the second finned plate.

The first and second predetermined spacings may be offset from each other to allow the fins to interconnect together (e.g. mesh together).

Interconnect may be understood to mean that the fins of the first and second finned plates share the same volume of space within the heat exchanger (e.g. sealed compartments) without interfering with each other.

Optionally, the fins of the first finned plate may have a predetermined orientation with respect to the fins of the second finned plate such that the fins interconnect within the heat exchanger in a predetermined arrangement.

Optionally, the fins of the first finned plate may be orientated at 30 degrees, 45 degrees, 60 degrees or 90 degrees clockwise with respect to the fins of the second finned plate.

The predetermined arrangement may be a herringbone arrangement, a weaving arrangement or a chevron arrangement.

Optionally, the heat exchanger may comprise guide vanes for guiding the flow of fluid through the heat exchanger.

Optionally, the first and second sheets are graphite, copper or aluminium sheets.

Any material with high thermal conductivity may be a suitable material for the first and second sheets.

Optionally, the thermal management system may further comprise a valve connected between at least two cooling channels, the valve may be configured to control the flow of fluid between the at least two cooling channels.

The valve may be unidirectional or bidirectional.

Optionally, the thermal management system may further comprise an auxiliary heat exchanger connected between the heat exchanger and the plurality of cooling channels, the auxiliary heat exchanger may be configured to dissipate heat from the fluid after the fluid flows through the heat exchanger.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the Figures, in which.

DETAILED DESCRIPTION OF THE DISCLOSURE

Aspects and embodiments of the present disclosure will now be discussed with reference to the accompanying figures. Further aspects and embodiments will be apparent to those skilled in the art.

FIG. 1

Figure 1:
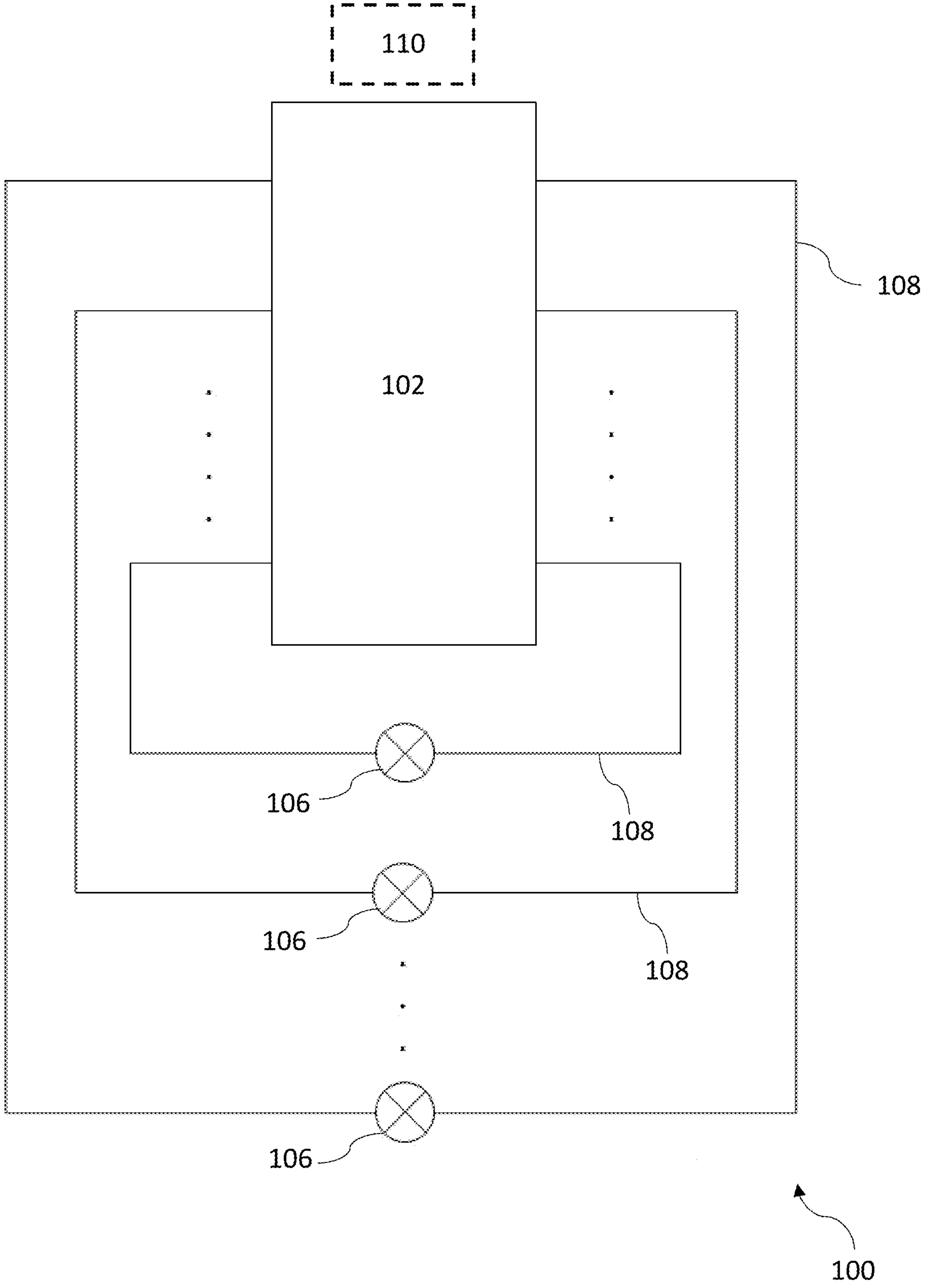
FIG. 1 is a schematic diagram of a thermal management system.

An exemplary thermal management system 100 for cooling at least one electronic component is shown in FIG. 1.

The thermal management system 100 is configured to cool at least one electronic component 110. That is, the thermal management system 100 may be connected (e.g. thermally connected) to an electronic component 110 in order that heat generated by the electronic component 110 is dissipated by the thermal management system 100. By dissipating heat away from one or more electronic components 110, the risk of the electronic component failure due to overheating is reduced.

The one or more electronic components 110 may be low, medium or high voltage (active) electronic components. For example, the one or more electronic components 110 may be transistors such as field effect transistors (e.g. MOSFETs), bipolar junction transistors (BST's), Gallium Nitride transistor (GaN), or insulated-gate bipolar transistors (IGBTs).

Referring to FIG. 1, the thermal management system 100 comprises a heat exchanger 102 connectable to at least one electronic component 110. As illustrated by the dashed line of the heat exchanger 102 of FIG. 1, the heat exchanger 102 (and the thermal management system 100 as a whole) is able to be directly connected to and disconnected from at least one electronic component 110. That is, the heat exchanger 102 may be directly connected to at least one electronic component 110 by mechanical fixings, such as screws or nuts and bolts. Additionally or alternatively, the heat exchanger 102 may be directly connected by a thermally conductive adhesive.

In some examples, the heat exchanger 102 may be connectable to plural electronic components 110. However, in the example illustrated in FIG. 1, the heat exchanger 102 is connectable to a single electronic component 110.

The thermal management system 100 further comprises a plurality of cooling channels 108 (e.g. metal or plastic cylindrical pipes). Each of the cooling channels 108 are connected to a respective pump 106 and the heat exchanger 102. As illustrated by the dashed lines in FIG. 1, the thermal management system 100 may comprise any number of cooling channels 108 and respective pumps 106. Three cooling channels 108 and respective pumps 106 are illustrated in the example of FIG. 1.

Each cooling channel 108 may be connected to a respective pump 106 and the heat exchanger 102 in a closed-circuit arrangement. The closed-circuit cooling channels may carry fluid between the heat exchanger 102 and the respective pump 106. The respective pumps 106 may pump fluid contained within the cooling channels 108 along the respective cooling channels 108 such that the fluid flows through the heat exchanger 102. The fluid may continuously flow between the heat exchanger 102 and the respective pump 106 of each cooling channel 108 while the respective pump is active (i.e. turned on and pumping).

Each cooling channel 108 may be sealed to the heat exchanger at an inlet (i.e. first location) and an outlet (i.e. second location). As illustrated in FIG. 1, the inlet and outlet of each cooling channel 108 may be located on opposite sides (i.e. opposite surfaces) of the heat exchanger 102. Fluid may enter the heat exchanger 102 from a respective inlet, pass through the heat exchanger 102, and exit the heat exchanger 102 back into the same cooling channel 108 at a respective outlet. The cooling channels 108 may be sealed to the heat exchanger 102 at the inlets and outlets to prevent fluid leaking from the cooling channels 108 as the fluid enters and exits the heat exchanger 102.

The heat exchanger 102 is configured to dissipate heat (i.e. dissipate heat away from the electronic component to which is it connectable) from the at least one electronic component 110 to fluid carried by the plurality of cooling channels 108. Therefore, heat generated by the one or more electronic components 110 (to which the heat exchanger 102 is connectable) may be transferred to the heat exchanger 102 and dissipated thereby cooling the one or more electronic components 110.

In some examples, the heat exchanger 102 may be a cold plate. A cold plate may be understood to be a device configured to cool electronic components by dissipating heat from electronic components to a fluid using a primary heat exchanger. The heat in the fluid may be dissipated to an ambient environment through an auxiliary heat exchanger by pumping the fluid between the cold plate and the auxiliary heat exchanger.

Alternatively, the heat exchanger 102 may be a heat sink configured to cool electronic components by dissipating heat from electronic components to an ambient environment without the use of a pump. Such a heat sink may comprise fins configured to increase the surface area of the heat sink thereby increasing the rate of heat dissipation as a fluid passes across the fins.

The fluid may be a liquid, such as water, glycol or a dielectric fluid, or a gas, such as air.

FIG. 2

Figure 2:
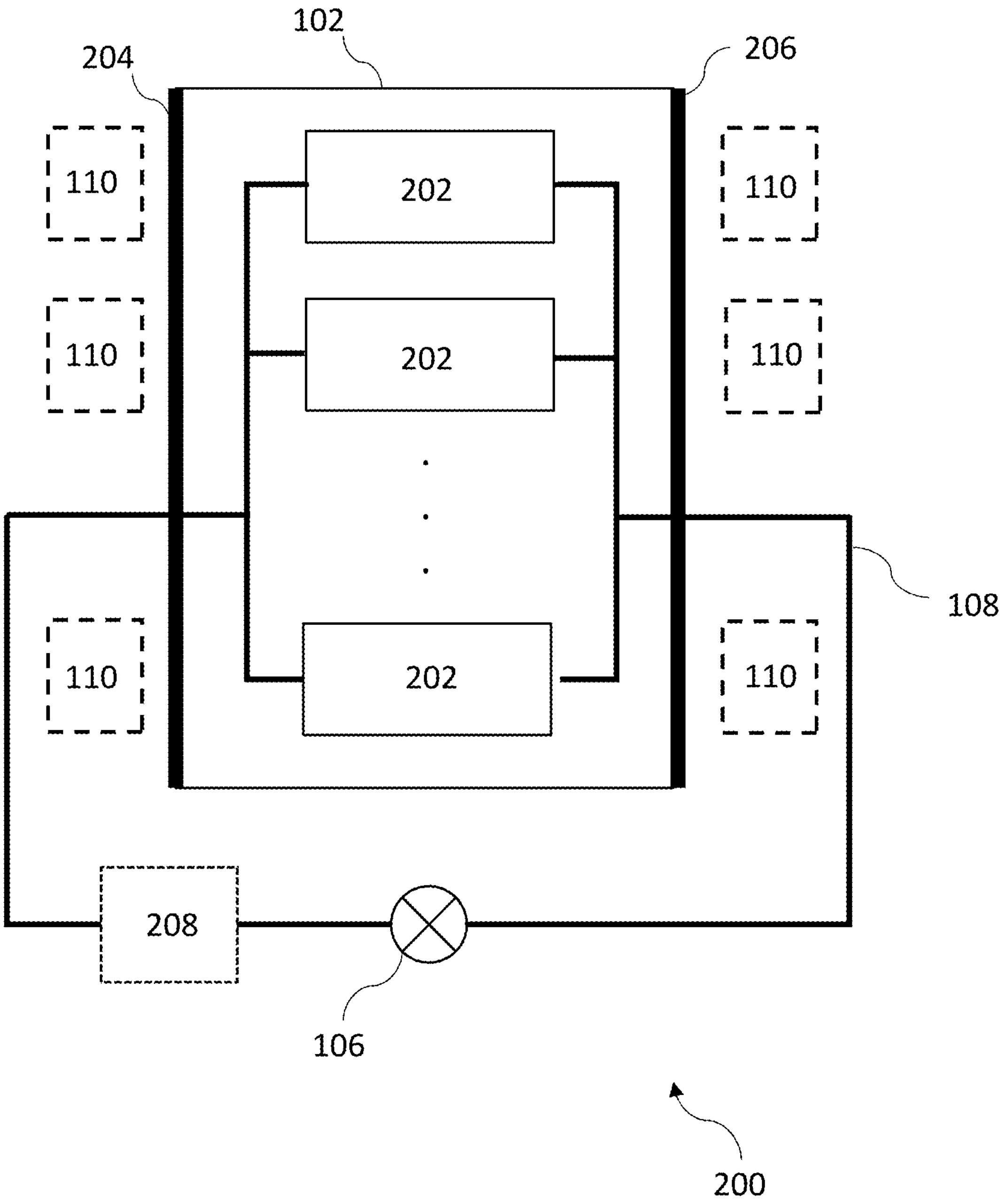
FIG. 2 is another schematic diagram of a thermal management system.

FIG. 2 illustrates another exemplary thermal management system 200 for cooling at least one electronic component 110. The thermal management system 200 of FIG. 2 includes at least the same features as the thermal management system 100 of FIG. 1, with like reference numerals denoting like parts. The description of the like features will be omitted for brevity.

In the example of FIG. 2, plural electronic components 110 are illustrated as being connectable to the heat exchanger 102. Further, a single cooling channel 108 is illustrated in the thermal management system of FIG. 2, but it will be understood that the thermal management system 200 may comprise plural cooling channels 108, as discussed above in relation the FIG. 1.

The heat exchanger 102 of the thermal management system 200 may comprise first and second sheets 204, 206 each comprising internal and external surfaces. That is, the internal surfaces may be internal surfaces of the heat exchanger 102 and the external surfaces may be external surfaces of the heat exchanger 102.

As illustrated in FIG. 2, the first and second sheets 204, 206 may be arranged opposite to and parallel with each other such that the internal surfaces of the first and second sheets 204, 206 face each other. The first and second sheets 204, 206 may form part of heat exchanger housing.

The external surfaces of the first and second sheets 204, 206 may face outwards away from the heat exchanger 102 in opposite directions.

The first and second sheets 204, 206 may be configured to conduct heat (i.e. to act as heat pipes) from the at least one electronic component 110 to the heat exchanger 102. In order to effectively conduct heat away from the electronic components 110, the first and second sheets 204, 206 may be made from graphite, copper, aluminium or silver.

The first and second sheets 204, 206 may be connected together (e.g. mechanically, by welding or fixings) to form a heat exchanger channel through which fluid flows. The plurality of cooling channels 108 may each be connected at opposite ends of the heat exchanger channel to form closed-circuits between the heat exchanger channel and the respective pumps 106.

Electronic components 110 may be mountable on both external surfaces of the first and second sheets 204, 206 (e.g. by using mechanical fixings such as nuts and bolts or screws). The electronic components 110 may be (thermally) mounted on the external surfaces in order that heat generated by the electronic components transfers to the heat exchanger 102.

The thermal management system 200 may comprise a plurality of sealed is compartments 202 positioned between the internal surfaces of the first and second sheets 204, 206.

Each sealed compartment 202 may be connected to at least one cooling channel 108 such that fluid flows through the sealed compartment 202 as the fluid is pumped along the at least one cooling channel 108. The sealed compartments 202 may be isolated from each other to prevent fluid from passing between the plurality of sealed compartments 202.

Each sealed compartment 202 may be connected to the same cooling channel 108 and/or to plural different cooling channels 108. That is, each individual cooling channel 108 may carry fluid through each sealed compartment 202. Alternatively, each sealed compartment 202 may have a dedicated cooling channel 108.

Fluid may enter each sealed compartment 202 from one or more respective cooling channels 108 at a respective sealed compartment inlet (i.e. first location), pass through the sealed compartment 202, and exit the sealed compartment 202 back into the same cooling channel 108 at a respective sealed compartment outlet second location).

The sealed compartments 202 may be positioned adjacently along a length of the heat exchanger between the first and second sheets 204, 206. That is, the sealed compartments 202 may be contained between the first and second sheets 204, 206 in the same plane (e.g. in a stacked arrangement).

The sealed compartments 202 may be in direct contact with both the first and second sheets 204, 206 such that heat generated by the at least one electronic component 110 is dispersed into (or towards) the sealed compartments 202 and dissipated into the fluid as the fluid passes through the sealed compartments 202. That is, the sealed compartments 202 may be separate units thermally connected to the internal surfaces of the first and second sheets 204, 206.

The heat exchanger 102 may dissipate heat from the at least one electronic component 110 to the fluid as the fluid flows through the sealed compartments 202.

Electronic components 110 may be mountable on the external surfaces of the first and second sheets 204, 206 at positions corresponding to positions of one or more sealed compartments within the heat exchanger 102. As illustrated in FIG. 2, the electronic components 110 may be mounted (directly) on both the external surfaces at positions directly opposite positions of the sealed compartments 202 which face the internal surfaces. That is, each electronic component may be aligned with a sealed compartment at a corresponding position on a first and/or second sheet 204, 206.

In some examples, each electronic component 110 may be mountable at a position corresponding to a position of an adjacent pair of sealed compartments such that each electronic component overlaps at least two sealed compartments. First and second sealed compartments of each adjacent pair may be connected to a first cooling channel and a second cooling channel, respectively (i.e. each sealed compartment of an adjacent pair is supplied by a different cooling channel).

In examples where the plurality of cooling channels 108 comprise a pipes (e.g. cylindrical pipes), the cylindrical pipe of a given cooling channel 108 may have the same cross-sectional diameter along a length of the pipe, or the cross-section diameter may vary. The cross-section diameter of the pipes may vary between different cooling channels 108 to control the rate of flow of the fluid as it is pumped through the respective pipes.

Where the cooling channels 108 comprise pipes, the pipes may comprise sealed compartment inlets and sealed compartment outlets. The sealed compartment inlets may connect pipes of respective cooling channel 108 to inputs of the sealed compartments 202 to allow fluid to flow into the sealed compartments 202. The sealed compartment outlets may connect pipes of respective cooling channels 108 to outputs of the sealed compartments 202 to allow fluid to flow out of the sealed compartments 202.

The diameter of the sealed compartment inlets and/or sealed compartment outlets may vary according to relative positions of the sealed compartments to which the respective pipe is connected. For example, the diameter of the sealed compartment inlets and/or sealed compartment outlets may decrease as a distance between the respective pipe and the respective pump increases in order to control a constant rate of flow of fluid across the sealed compartments 202.

In some examples, the thermal management system 200 may further comprise an auxiliary heat exchanger 208 (illustrated by dashed lines in FIG. 2) connected between the heat exchanger 102 and the plurality of cooling channels 108. The auxiliary heat exchanger 208 may be configured to dissipate heat from the fluid after the fluid flows through the heat exchanger 102. For example, heat contained in the fluid may be dissipated to an ambient environment through the auxiliary heat exchanger 208 by pumping the fluid between the (primary) heat exchanger 102 and the auxiliary heat exchanger 208. The auxiliary heat exchanger 208 may be, for example, a heat sink, as discussed above.

FIG. 3

Examples of sealed compartment arrangements will now be described with reference to FIG. 3.

Figure 3:
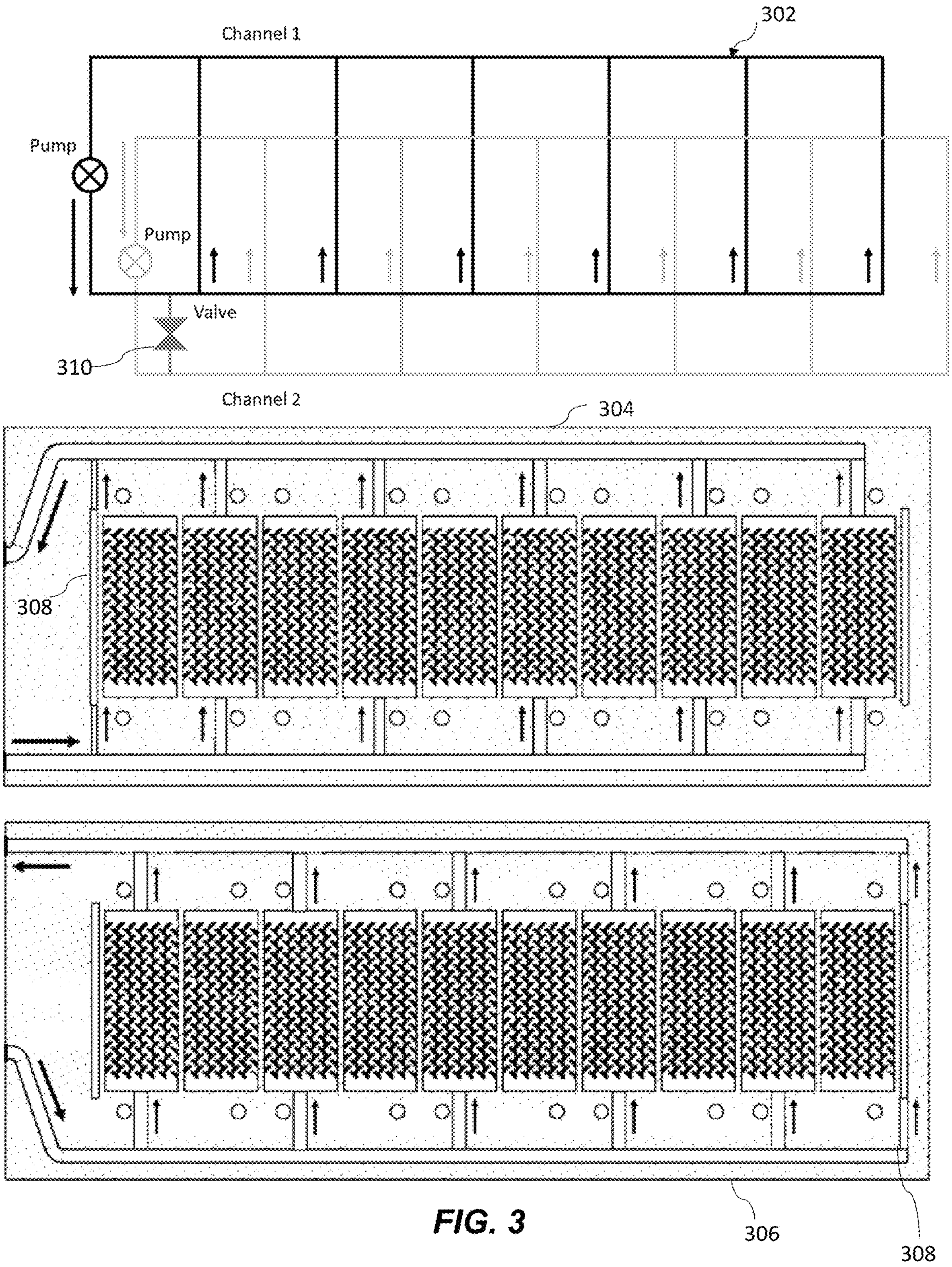
FIG. 3 shows a schematic diagram of cooling channel layouts and cross-sectional views of a heat exchanger.

FIG. 3 shows an example in which the thermal management system 200 comprises first and second cooling channels. The arrangement of first and second cooling channels is illustrated by channel layout 302 in FIG. 3 (labelled Channel 1 (darker shade) and Channel 2 (lighter shade)). The direction of flow of fluid through the first and second cooling channels is indicated with arrows in the channel layout 302.

The first and second channels are offset in FIG. 3 in order to clearly illustrate the two channels. It will be understood that the first and second channels may be stacked thereby effectively sharing the same footprint within the heat exchanger 102.

Cross-sections of the thermal management system 200 are illustrated in cross-sectional views 304 and 306 of FIG. 3, both of which comprise the same sealed compartments one to ten (ordered from left to right in both cross-sectional views 304 and 306). The direction of flow of fluid through the first and second cooling channels is indicated with arrows in both cross-section views 304, 306, The circular shapes positioned above and below the sealed compartments in FIG. 3 illustrate mounting holes for mounting the at least one electronic component, the sheets and/or the finned plates to the heat exchanger 102.

Cross-sectional view 304 illustrates the first cooling channel (Channel 1) connected to a first group of sealed compartments. The first group of sealed compartments are sealed compartments 1, 3, 5, 7 and 9 in FIG. 3, The first cooling channel comprises an auxiliary cooling channel 308. Cross sectional view 306 illustrates the second cooling channel (Channel 2) connected to a second group of sealed compartments. The second group of sealed compartments are sealed compartments 2, 4, 6, 8 and 10 in FIG. 3. The second cooling channel comprises an auxiliary cooling channel 308.

In the example of FIG. 3, the first and second groups of sealed compartments alternate within the heat exchanger. It will be understood that the first and second groups of sealed compartments may be arranged in alternatively. For example, adjacent groups could be arranged such that the first group of sealed compartments may be sealed compartments 1 to 5 and the second group of sealed compartments may be sealed compartments 6 to 10. Alternatively, all sealed compartments 1 to 10 may be connected to both the first and second cooling channels.

In some examples, a first electronic component may be mountable at a position directly above sealed compartments 1 and 2 of FIG. 3. Thus, this introduces a fail-safe fault-tolerant design. That is, in examples comprising ten sealed compartments, five electronic components may be mounted on one surface, each of which is cooled by at least two compartments. Therefore, if channel 1 of FIG. 3 became faulty thereby preventing at least one of the sealed compartments connected to (i.e. supplied by) channel 1 from not working, heat is transferred to another (e.g. adjacent) sealed compartment (e.g., the first and/or second sheet functioning as heat pipes) to dissipate heat. Thus the fault tolerant capability of the thermal management system is improved, because of the fact that two independent channels cool each component.

In some examples, at least one cooling channel 108 may comprise an auxiliary is cooling channel 308 (e.g. a plastic or metal cylindrical pipe) positioned along an edge of the heat exchanger 102 and which bypasses the sealed compartments 202. In the cross-sectional views 304, 306 of FIG. 3, the auxiliary cooling channel 308 is illustrated as being positioned before and/or after the adjacent sealed compartments 202, between an inlet and an outlet of the respective cooling channels. It will be understood that the auxiliary cooling channel 308 may be positioned at any location within the heat exchanger 102 which is external to the sealed compartments 202.

The auxiliary cooling channel 308 may carry fluid through an edge of the heat exchanger to prevent areas of the heat exchanger 102 a predetermined distance away from the sealed compartments 202 and/or fluid (e.g. 10 millimetres, 20 millimetres) from overheating. For example, if Channel 2 of 302 failed, sealed enclosure ten would not be supplied with water, in which case sealed enclosure nine would partially cool sealed enclosure ten. However, the side of sealed compartment ten opposite (far right hand side of the heat exchanger in 306) to sealed compartment nine would develop a "hot spot". Thus, auxiliary cooling channel 108 prevents such a "hot spot" from developing. Similar applies to Channel 1 of 302 with the sealed compartment one (i.e. on the far left hand side of the heat exchanger in 308).I As illustrated in cross-sectional views 304 and 306, a cross-sectional diameter of the auxiliary cooling channel 308 may be less than a cross-sectional diameter of the cooling channel 108 to which it is connected.

The thermal management system 200 may comprise a valve 310 connected between at least two cooling channels (i.e. Channel 1 and Channel 2 in 302). The valve 310 may be connected to two separate cooling channels 108 or may be connected to more than two cooling channels 108.

The valve 310 may be unidirectional such that when the valve 310 is opened fluid is controlled to flow in a single direction through the valve 310 from one cooling channel into another. Alternatively or additionally, the valve 310 may be bidirectional such that when the valve 310 is opened fluid is controlled to flow in both directions through the valve 310 between plural cooling channels 108.

The valve 310 may control fluid to flow from one cooling channel 108 into one or more different cooling channels 108. Further, the valve 310 may control fluid to flow in both directions between two or more cooling channels.

In some examples, the heat exchanger 102 may comprise a plurality of fins, and the fins may interconnect with each other within the heat exchanger 102. In the cross-sectional views 304, 306 of FIG. 3, the fins interconnect with each other within the sealed compartments 202.

The fins may be thermally connected to the inner surfaces of the first and second sheets 204, 206, respectively, and/or the heat exchanger 102 and the fins may extend into the heat exchanger 102. Such an arrangement of fins may provide a means for the heat exchanger 102 to dissipate heat from the at least one electronic component 110 to the fluid via the fins as fluid flows across the fins (i.e. the fluid impinges the flow of fluid) within the heat exchanger 102.

The impingement of fluid through the heat exchanger 102 may be controlled by varying the shape of the fins. For example, the cross-sectional shape of the fins may be trapezoidal, triangular, rectangular, semi-circular, circular, elliptical, rectangular with curved corners (rounded rectangular), airfoil shapes (National Advisory Committee for Aeronautics (NACA) airfoil, for example), or a combination thereof.

Figure 5:
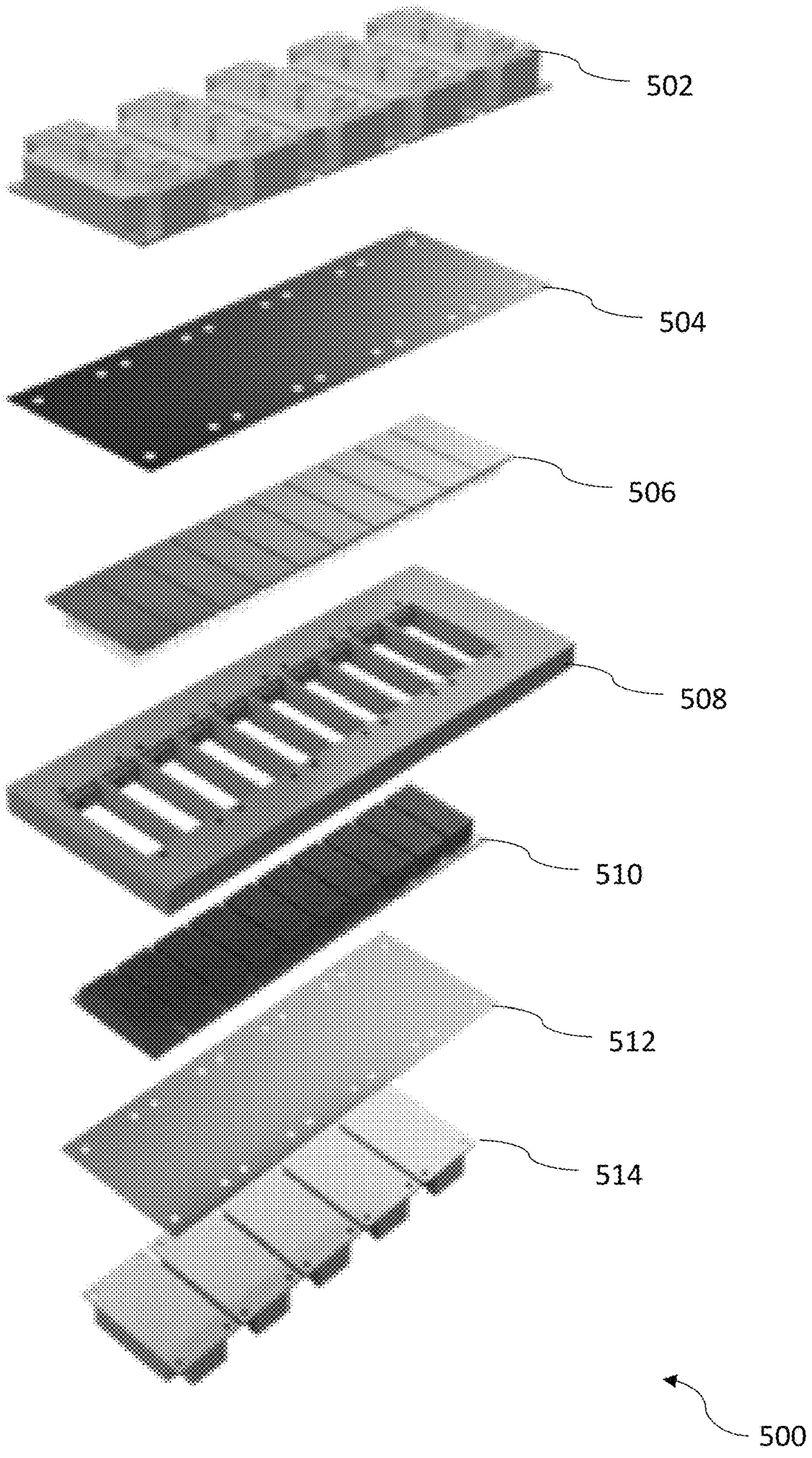
FIG. 5 is an exploded view of a heat exchanger.
Figure 6:
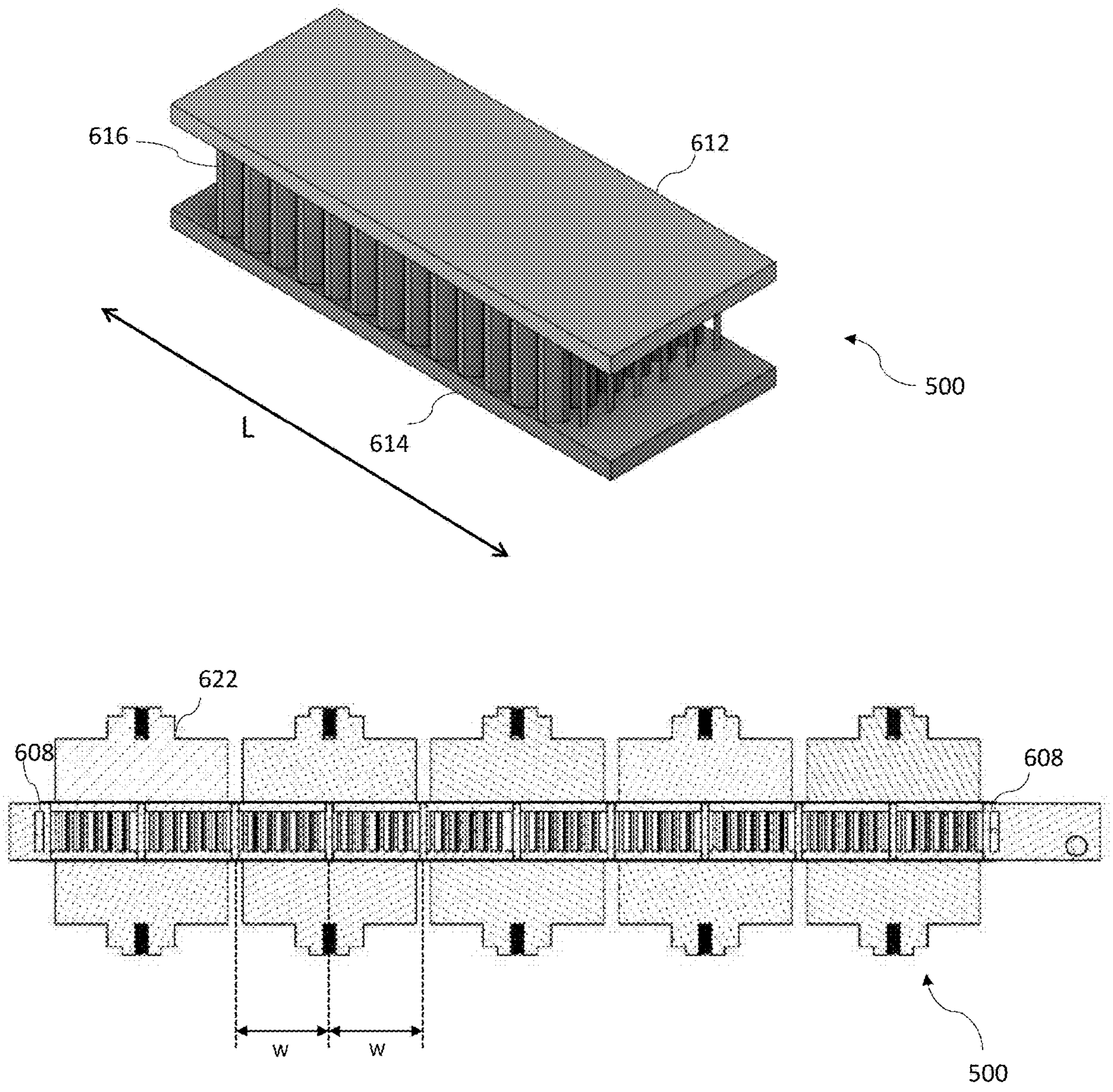
FIG. 6 shows an assembled heat exchanger and another cross-sectional view of a heat exchanger.

The fins may be connected to first and second opposing finned plates (as illustrated in FIGS. 5 and 6, below). The first and second finned plates may be positioned directly opposite each other within the heat exchanger such that the fins may extend towards each other thereby interconnecting together.

The fins of the first finned plate may have a first predetermined spacing across the first finned plate and fins of the second finned plate may have a second predetermined spacing across the second finned plate such that the fins interconnect is within the heat exchanger 102 in a predetermined arrangement. Further, the fins of the first finned plate may have a predetermined orientation (e.g. 30 degrees, 45 degrees, 60 degrees, or 90 degrees clockwise) with respect to the fins of the second finned plate such that the fins interconnect within the heat exchanger in a predetermined arrangement. The predetermined arrangement may be a herringbone arrangement, a weaving arrangement or a chevron arrangement, for example.

The first and second predetermined spacings may be offset from each other to allow the fins to interconnect together (e.g. mesh together).

The fins may be equally distributed across the first and second finned plates according to the first and second predetermined spacings.

Figure 4:
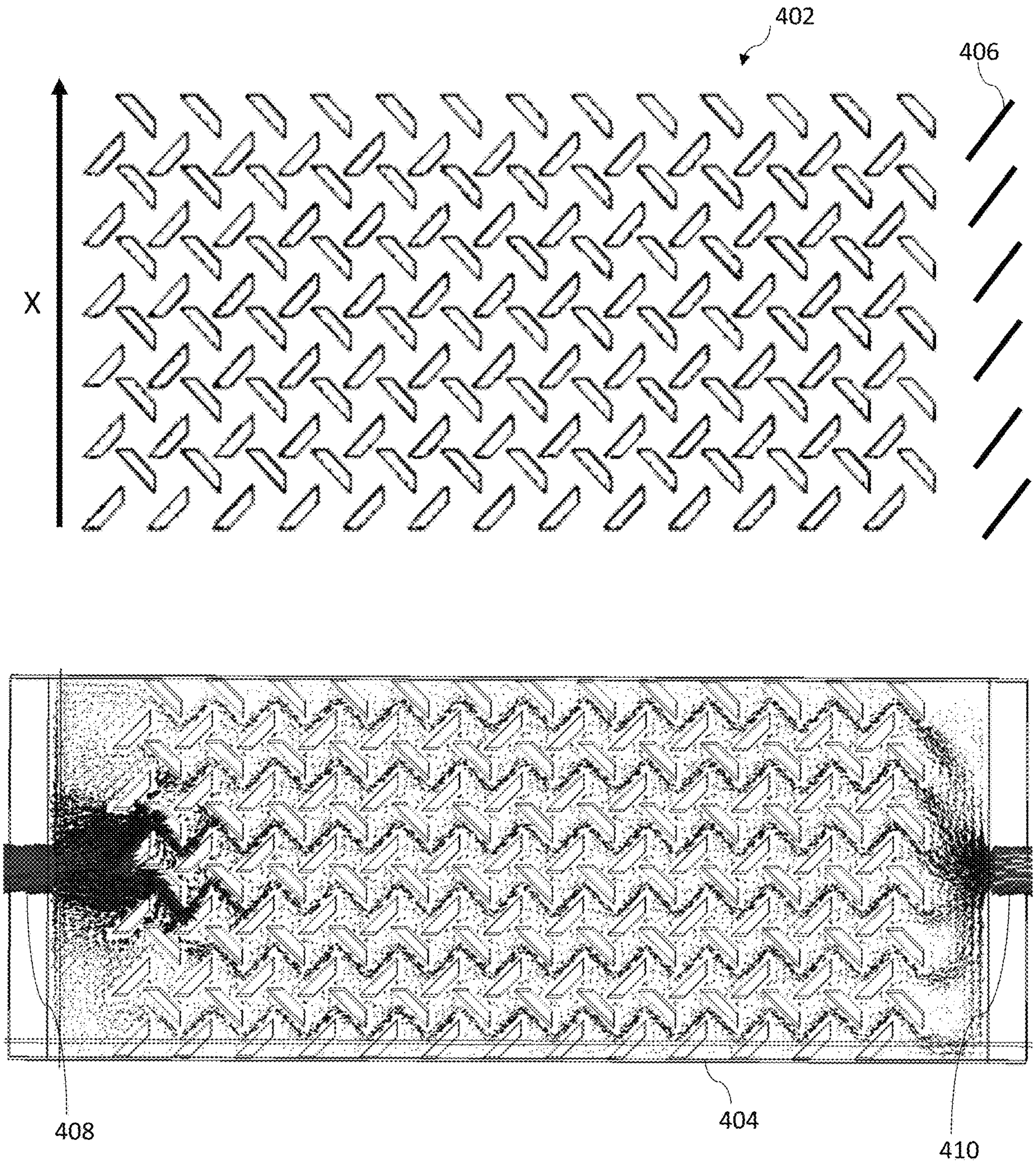
FIG. 4 shows cross-sectional views of interconnected fins of a heat exchanger.

An example of fins having a first predetermined spacing, a second predetermined spacing and a relative predetermined orientation is illustrated in FIG. 4.

FIG. 4

FIG. 4 shows cross-sectional views of interconnected fins of the first and second opposing finned plates. In the examples of FIG. 4, the fins of the first opposing finned plate are orientated at 45 degrees clockwise with respect to an x-axis and the fins of the second opposing finned plate are orientated at 45 degrees anticlockwise with respect to the x-axis. The relative orientation between the fins of the first and second opposing finned plates is therefore 90 degrees.

The fins in the cross-sectional view of interconnected fins 402 have a trapezoidal cross-section. Cross-sectional view 404 illustrates fluid flowing across the trapezoidal fins (from an input 408 to an output 410), which shows how impingement of the fluid by trapezoidal fins controls fluid flow.

In some examples, the heat exchanger 102 may comprise guide vanes 406 for guiding the flow of fluid through the heat exchanger 102. The guide vanes 406 may be positioned adjacently to the fins on a single side of the fins (as illustrated in cross-sectional view 402) or on plural sides of the fins. The guide vanes may be configured to evenly distribute the flow of fluid across the fins.

Further examples of the thermal management systems 100, 200 will now be described with reference to FIGS. 5 and 6, below.

FIG. 5

An exploded view of the heat exchanger 102 is illustrated in FIG. 5. The heat exchanger 102 of FIG. 5 comprises a body 508 positioned between first and second finned plates 506, 510. Fins of the first and second finned plates 506, 510 extend into sealed compartments of the body 508. First and second sheets 504, 512 are connected on opposite sides of the main body to contain the finned plates 506, 510 against the body 508. The first and second sheets 504, 512 are connected to the body 508 at connection holes illustrated in the first and second sheets 504, 512 and the body.

The sealed compartments of the body 508 may be sealed by, for example, welding the edges of the finned plates 506, 510 to the body 508 (each sealed compartment being formed by the first finned plate 506, the second finned plate 510, and the body 508). Once sealed, fluid may flow through each sealed compartment individually without fluid passing between sealed compartments.

A first group of electronic components 502 are connected to an external surface of the first sheet 504 and a second group of electronic components 514 are connected to an external surface of the second sheet 512, That is, the first sheet 504 is connected between the first group of electronic components 502 and the first finned plate 506 and the second sheet 512 is connected between the second group of electronic components 514 and the second finned plate 510. The groups of electronic components 502, 514 are connected to the body 508 and/or the first and second sheets 504, 512 at connection holes illustrated in the groups of electronic components 502, 514.

Mounting electronic components on both sides of the heat exchanger 500 provides efficient use of space. That is, double sided mounting provides ten (or more) electronic components to be mounted on the heat exchanger 500, with five (or more) electronic components mounted on opposite sides. This improves the overall is utilisation of space within a heat exchanger enclosure (not shown) in which the heat exchanger 500 is contained. The double sided mounting also simplifies the overall heat exchanger enclosure and thermal management system packaging and design. This improvement in efficiency and simplification increases as the number of electronic components mounted on the same heat exchanger 500 increases.

The double side mounting of electronic components may be enabled using the first and second finned plates 506, 510. During assembly, first and second finned plates 506, 510 form an interlocking structure and fit into the body 508. Edges of the finned plates 506, 510 are welded to the body 508, which creates the sealed compartments, Both finned plates 506, 510 have trapezoidal fins, which allows for mounting on both sides as heat can be dissipated very effectively. The trapezoidal fins not only serve as the primary finned surface for heat transfer, but also as guide vanes to direct fluid flow onto an adjacent fin surface, creating an impinging effect. This improves the heat transfer capability of the fins. This impingement effect is repeated by other fins thus creating a "zigzag" pattern (i.e. weaving pattern) of fluid flow within the finned channel, as illustrated in cross sectional view 404 of FIG. 4.

The first and second sheets 504, 512 are configured to evenly and efficiently distribute heat throughout the heat exchanger 500. The first and second sheets 504, 512 may be made from, for example, graphite. That is, the first and second sheets 504, 512 evenly distribute heat between the respective finned plates 506, 510 underneath the respective groups of electronic components 502, 514 thereby ensuring thermal equilibrium between both cooling channels 108. In case of a single channel failure, these sheets 504, 512 provide a means for effective heat transfer from the disabled finned channel to the working finned channel, ensuring maximum heat dissipation without significant temperature rise. The sheets may be made from graphite, copper, silver or aluminium. The sheets may alternatively be referred to as heat pipes.

The two cooling channels may comprise a valve (or a bypass), such as valve 310 discussed above, between the cooling channels which may provide a means for unidirectional and/or bidirectional flow of fluid between the cooling channels. Thus, in case of a pump failure, the power supplied to the pump of the operational cooling is channel can be increased (thus the capable pressure head as per the pump pressure head curve), and valve opened, which will allow the functioning pump to supply fluid to the other channel as well, ensuring cooling capabilities are maintained and no system shutdown is necessary.

In some examples, a single large heat exchanger with two fluid inlets and two fluid outlets can be used to dissipate the heat from the system (i.e. without the above discussed sealed compartments). A radiator like design may alternatively be used with alternating pipes of each channel.

FIG. 6

The first and second finned plates 506, 510 have an interlocking fit into the body 508, as illustrated by the (assembled) heat exchanger 500 at the top of FIG. 6.

A cross-section of the length (L) of the heat exchanger 500 is illustrated in cross-sectional view 620, at the bottom of FIG. 6. The cross-sectional view 620 illustrates sealed compartments one to ten (from left to right) each having a width (W). The interlocking fins are illustrated within the sealed compartments. Electronic components 622 (e.g. power electronic modules) are mounted on the first and second sheets 504, 512 of the heat exchanger 500.

Two isolated cooling channels provide fluid to the heat exchanger 500 to cool the electronic components 622, as discussed above in relation to FIG. 3. Each channel is configured to cool alternative sealed compartments such that each channel cools five electronic components.

To ensure adequate cooling for all ten (or more) electronic components and to maintain a fail-safe functionality, the heat exchanger 500 is supplied by two independent and isolated cooling channels 108. Each cooling channel is equipped with its own pump and supplies fluid to the heat exchanger 500. Each cooling channel 108 cools five sealed enclosures in an alternating arrangement as illustrated in FIG. 3. This design ensures that both cooling channels 108 individually and independently play a role in cooling the ten electronic components and split the heat load evenly during normal operation. Thus, the overall heat generated by the is electronic components is dissipated through two channels rather than only one.

The purpose of the plural cooling channels is to improve the redundancy of thermal management systems (such as the thermal management systems 100, 200 discussed above) by providing at least one spare cooling channel to manage a heat load in case of a single cooling channel failure. Configuring each cooling channel to supply alternating sealed enclosures ensures that, during single cooling channel operation, heat can be adequately dissipated by the remaining functioning cooling channel while the electronic components operate at full capacity (or slightly reduced capacity) without the entire thermal management system 100, 200 shutting down. Furthermore, the effects of critical failures like single pump failure (stagnant fluid) and single cooling channel fluid leak (fluid replaced with stagnant air) can be avoided through this arrangement. In summary, the plural cooling channels and their respective pumps being connected to a heat exchanger in the thermal management system 100, 200 improves the fault tolerance of the thermal management system 100, 200T.

Another advantage provided by isolated cooling channels is the ability to use different fluids for different channel in the same thermal management system 100, 200.

Furthermore, a 50-50 water-glycol homogenous mixture may be used to utilise the high specific heat capacity of water and the excellent temperature dependent properties of glycol. Using such a fluid mixture allows effectiveness to be maintained at a large range of temperatures while also ensuring operational ability at high altitudes.

The heat exchanger 500 comprises two auxiliary cooling channels 608 (i.e. an extra two narrow channels) positioned at opposite ends of the heat exchanger 500, beside the first sealed compartment and the tenth sealed compartment. The two auxiliary cooling channels 608 ensure that there is no development of hot spots near the edges and corners of the heat exchanger 500.

In some examples, each sealed enclosure also has a different enclosure inlet and is outlet diameter, to ensure similar mass flow rates of fluid pass through all the sealed enclosures.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A thermal management system for cooling at least one electronic component, the thermal management system comprising:

a heat exchanger connectable to at least one electronic component, the heat exchanger configured to dissipate heat generated by the at least one electronic component;

the heat exchanger comprises first and second sheets, each of the first and second sheets comprising an external surface and an internal surface, at least one electronic component is mountable on the external surface of the first sheet, and at least one electronic component is mountable on the external surface of the second sheet;

a plurality of cooling channels each connected to a respective pump and the heat exchanger, wherein:

each cooling channel is configured to carry fluid between the heat exchanger and the respective pump, and each pump is configured to pump fluid along the respective cooling channel such that fluid carried by each cooling channel flows through the heat exchanger.

2. The thermal management system according to claim 1, wherein:

the heat exchanger comprises a plurality of sealed compartments positioned between the internal surfaces of the first and second sheets, each sealed compartment is connected to at least one cooling channel such that fluid flows through the sealed compartment, and electronic components are mountable on the external surfaces of the first and second sheets at positions corresponding to positions of one or more scaled compartments.

3. The thermal management system according to claim 2, wherein:

the plurality of cooling channels each comprise a pipe, each pipe being connected to a respective sealed compartment inlet and a respective sealed compartment outlet such that fluid flows through the pipes and the respective sealed compartments, and the diameter of the sealed compartment inlets and/or sealed compartment outlets vary according to a position of the at least one sealed compartment to which the respective pipe is connected.

4. The thermal management system according to claim 3, wherein the diameter of the sealed compartment inlets and/or the sealed compartment outlets decreases as a distance between the respective sealed compartment and the respective pump increases.

5. The thermal management system according to claim 2, the plurality of cooling channels comprising first and second cooling channels, wherein:

the first cooling channel is connected to a first group of sealed compartments, and the second cooling channel is connected to a second group of sealed compartments.

6. The thermal management system according to claim 5, wherein:

the sealed compartments of the first and second groups of sealed compartments alternate within the heat exchanger, exchanger, and each electronic component is mountable at a position corresponding to a position of an adjacent pair of sealed compartments, wherein first and second sealed compartments of each adjacent pair are connected to the first cooling channel and the second cooling channel, respectively.

7. The thermal management system-according to claim 2, wherein at least one cooling channel comprises an auxiliary cooling channel positioned along an edge of the heat exchanger, and which bypasses the sealed compartments, such that fluid flows through the auxiliary cooling channel at the edge of the heat exchanger.

8. The thermal management system according to claim 7, wherein a cross-sectional diameter of the auxiliary cooling channel is less than a cross-sectional diameter of the at least one cooling channel.

9. The thermal management system according to claim 1, wherein the heat exchanger comprises a plurality of fins, and wherein the fins interconnect with each other within the heat exchanger.

10. The thermal management system according to claim 2, wherein the fins interconnect with each other within the sealed compartments.

11. The thermal management system-according to claim 9, wherein the fins have a trapezoidal, triangular, rectangular, semi-circular, circular, elliptical, rectangular, or airfoil cross-sectional shape.

12. The thermal management system according to claim 9, wherein the heat exchanger comprises first and second opposing finned plates both comprising the fins, and fins of the first finned plate have a first predetermined spacing across the first finned plate and fins of the second finned plate have a second predetermined spacing across the second finned plate such that the fins interconnect within the heat exchanger in a predetermined arrangement.

13. The thermal management system-according to claim 12, wherein the fins of the first finned plate have a predetermined orientation with respect to the fins of the second finned plate such that the fins interconnect within the heat exchanger in a predetermined arrangement.

14. The thermal management system according to claim 1, wherein the heat exchanger comprises guide vanes for guiding the flow of fluid through the heat exchanger.

15. The thermal management system according to claim 1, wherein the first and second sheets are graphite, copper, silver or aluminium sheets.

16. The thermal management system according to claim 1, the thermal management system further comprising a valve connected between at least two cooling channels, the valve configured to control the flow of fluid between the at least two cooling channels.

17. The thermal management system according to claim 1, the thermal management system further comprising an auxiliary heat exchanger connected between the heat exchanger and the plurality of cooling channels, the auxiliary heat exchanger configured to dissipate heat from the fluid after the fluid flows through the heat exchanger.

* * * * *